United States Patent
Khenkin et al.

(10) Patent No.: US 11,942,468 B2
(45) Date of Patent: Mar. 26, 2024

(54) SYMMETRIC LAYOUT FOR HIGH-VOLTAGE AMPLIFIER

(71) Applicant: Cirrus Logic International Semiconductor Ltd., Edinburgh (GB)

(72) Inventors: Aleksey Khenkin, Nashua, NH (US); Justin Richardson, Edinburgh (GB); Michael Robinson, Edinburgh (GB); David Patten, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 479 days.

(21) Appl. No.: 17/303,251

(22) Filed: May 25, 2021

(65) Prior Publication Data

US 2022/0384413 A1 Dec. 1, 2022

(51) Int. Cl.
| | | |
|---|---|---|
| *H03F 3/195* | (2006.01) | |
| *H01L 21/78* | (2006.01) | |
| *H01L 23/498* | (2006.01) | |
| *H01L 23/66* | (2006.01) | |
| *H01L 27/02* | (2006.01) | |
| *H03F 3/187* | (2006.01) | |
| *H03F 3/45* | (2006.01) | |

(52) U.S. Cl.
CPC .......... *H01L 27/0207* (2013.01); *H01L 21/78* (2013.01); *H01L 23/49816* (2013.01); *H01L 23/66* (2013.01); *H03F 3/187* (2013.01); *H03F 3/45475* (2013.01); *H01L 2223/6644* (2013.01); *H03F 2200/03* (2013.01)

(58) Field of Classification Search
CPC .................................................... H03F 3/195
USPC ..................................... 330/307, 124 R, 295
See application file for complete search history.

(56) References Cited

U.S. PATENT DOCUMENTS

| | | | | |
|---|---|---|---|---|
| 6,054,900 | A * | 4/2000 | Ishida | H03F 3/604 455/127.3 |
| 6,842,071 | B1 * | 1/2005 | Retz | H03F 3/45475 330/133 |
| 11,621,673 | B2 * | 4/2023 | Nanan | H01L 24/49 330/295 |
| 2008/0252372 | A1 | 10/2008 | Williams | |

(Continued)

OTHER PUBLICATIONS

International Search Report dated Aug. 26, 2022 during examination of International Application No. PCT/US2022/072312.

(Continued)

*Primary Examiner* — Henry Choe
(74) *Attorney, Agent, or Firm* — Norton Rose Fulbright US LLP (57) ABSTRACT

A packaged semiconductor die may include a package terminal array comprising a plurality of terminals, wherein a spacing between the plurality of terminals of the ball grid array is less than 0.5 mm. First and second high-voltage circuits of the die may output a differential signal to a first and second terminal that may exceed 15 volts, in which the first high-voltage circuit and the second high-voltage circuit are positioned symmetrically around an axis and in which the first terminal and the second terminal are located at an edge of the package terminal array. A low-voltage circuit may be coupled to a third terminal and positioned between the first high-voltage circuit and the second high-voltage circuit, wherein the low-voltage circuit comprises circuitry organized in columns aligned along an axis and having a width defined by a fraction of the terminal spacing pitch.

20 Claims, 6 Drawing Sheets

(56) References Cited

U.S. PATENT DOCUMENTS

2009/0289722 A1* 11/2009 Dropmann ................ H03F 1/56
330/303
2014/0022020 A1* 1/2014 Aaen ................ H01L 23/49582
257/659
2023/0327624 A1* 10/2023 Komposch .............. H01L 23/66
330/51

OTHER PUBLICATIONS

Morrow, Gaalaas, McCarthy: "A 20-W Stereo Class-D Audio Output Power Stage in 0.6-um BCDMOS Technology" IEEE Journal of Solid-State Circuits, IEEE, USA, vol. 39, No. 11, Nov. 2, 2004 (Nov. 2, 2004), pp. 1948-1958.

* cited by examiner

SYMMETRIC LAYOUT FOR HIGH-VOLTAGE AMPLIFIER

FIELD OF THE DISCLOSURE

The instant disclosure relates to circuitry layouts. More specifically, portions of this disclosure relate to circuitry layout for high-voltage amplifiers.

BACKGROUND

Circuits for processing high voltage signals are difficult to design because high voltages can lead to unintentional results when the high voltages cause unintended coupling between electrical paths in a device. Spacing between electrical paths are increased to accommodate higher voltages on the electrical paths to prevent breakdown of the insulators around the electrical path. In an integrated circuit (IC), the electrical paths may be metal traces through and on a semiconductor substrate and the packaging of the substrate. As electrical devices are reduced in size, the spacing between the electrical paths is likewise reduced, which increases challenges for designing high-voltage circuitry that does not suffer the unintended results that reduce device performance or reliability.

Shortcomings mentioned here are only representative and are included simply to highlight that a need exists for improved electrical components, particularly for audio devices employed in consumer-level devices, such as mobile phones. Embodiments described herein address certain shortcomings but not necessarily each and every one described here or known in the art. Furthermore, embodiments described herein may present other benefits than, and be used in other applications than, those of the shortcomings described above.

SUMMARY

Integrated circuits that contain circuitry for processing high-voltage signals can be designed to accommodate higher voltages at smaller sizes according to aspects of the embodiments described herein. An integrated circuit includes a semiconductor die containing circuitry configured to operate on electrical signals. The semiconductor die is packaged to improve handling of the circuitry, such as in the assembly of electronic devices for consumer products. The packages include a packaging terminal array that couples the circuitry inside the package to components outside the package or components in other packages. Embodiments described herein may couple high-voltage electrical signals to particular terminals of the array to improve handling of the high-voltage electrical signals. Embodiments described herein may organize the circuitry on the semiconductor die with respect to the packaging terminal array in a manner to facilitate the handling of the high-voltage electrical signals with improved reliability.

Integrated circuits with high-voltage outputs organized as described according to aspects of the embodiments may be useful in providing a high-voltage output signal for further processing by another component or for driving one or more loads. Example loads driven by an integrated circuit with high-voltage output may be include a piezoelectric transducer, a haptic transducer or backlight for example, among other components receiving bipolar output voltage signals that may exceed an available supply voltage. In one application involving the use of high-voltage circuitry to amplify audio signals, the high-voltage outputs may be used to drive a piezoelectric transducer to reproduce sounds represented in an input audio signal to allow a user to listen to music, sounds, or notification noises at a desired volume level. The audio signals for amplification may be received as analog signals or as digital signals, in which the digital signals can be converted to analog signals for amplification through a digital-to-analog converter (DAC) that is part of the semiconductor die or part of a separate die in the same package or a different package.

In some embodiments of a semiconductor die, an output stage of high-voltage circuitry may have a differential output, such that the output is in the form of a differential between two terminals. One example of such high-voltage circuitry is a high-voltage differential amplifier. Such a high-voltage circuit may be split between left and right portions of circuitry relative to a central axis, which may be an axis of symmetry for the semiconductor die or an axis of symmetry for the high-voltage circuitry. Dividing the high-voltage circuitry around an axis may provide improvements to thermal management in the circuitry. For example, the high-voltage circuitry may have more area to dissipate heat by spacing apart the two portions. Additionally, the heat generated by the high-voltage circuitry may be distributed symmetrically across the die, reducing mechanical stresses and device mismatch due to steep and/or non-uniform temperature gradients. This benefit may, among other benefits, reduce errors resulting from mechanical drift in resistors, transistors, and/or other components.

The output terminals for the high-voltage circuitry on a package may be located at a periphery of the package to reduce or eliminate issues arising from the high-voltage electrical signals being routed too close to other electrical paths and creating unintentional results. Similarly, high-voltage inputs, such as for receiving feedback from a load or inputs from other circuitry, may be located at the periphery of the package. The periphery of the package refers to an outer boundary of the package. In some embodiments in which the semiconductor die is sized approximately the same as the package, the periphery of the package may also be the periphery of the semiconductor die. A package terminal array may be used to couple circuitry on the semiconductor die in the package to circuitry external to the package. One example of a package terminal array is a ball grid array (BGA), which may be an array of pads on a side of the package for attaching the package to another component. The BGA may include solder balls for forming an electrical coupling to a printed circuit board (PCB) that interconnects several packages. Another example of a package terminal array is a pin grid array (PGA), which may be an array of pins on a side of the package for inserting the package into a socket for forming an electrical coupling to a PCB. A further example of a package terminal array is a land grid array (LGA). In some embodiments, the high-voltage input and/or outputs may be located at an edge of the package terminal array, regardless of whether the package terminal array is at a periphery of the semiconductor die or a periphery of the package. An edge terminal may be an outermost terminal of an array having no further terminals in at least one direction from the edge terminal.

In some embodiments, the high-voltage circuitry may be generically organized as first and second high-voltage circuits that are formed around an axis central to the high-voltage circuits. The first and second high-voltage circuits may have outputs coupled to edge terminals of a package terminal array of the package enclosing the semiconductor die. A signal path through the semiconductor die may begin as a digital input at one side of the semiconductor die, processed through low-voltage (e.g., small-signal) analog and/or digital circuitry bordering that side and then split to left and right portions of a high-voltage circuit with output stages aligned symmetrically around an axis and around the low voltage analog and/or digital circuitry. The signal path continues through the left and right portions of the high-voltage circuit to output terminals at an edge of the package terminal array coupled to the semiconductor die. Locating the high-voltage terminals at the edges of the array may provide clear paths for PCB traces coupled to the terminals without impinging on high-voltage clearance requirements. In yet another advantage, the widths of the PCB traces are not limited by the inter-terminal spacing size, which may reduce or minimize $I^2R$ losses. Not being limited by the inter-terminal spacing size may also allow a continued reduction in the inter-terminal spacing without proportionately reducing the voltage of the high-voltage output.

The circuitry within the first and second high-voltage circuitry and/or the low-voltage circuitry around the high-voltage circuitry may be arranged in a symmetrical column-based layout in which the widths of the columns are fractionally related to the spacing or pitch between terminals of the package terminal array. The fractions may be defined as ratios of positive integer numbers not exceeding 12. The columns may be organized around voltage supply rails for providing positive and negative supply voltages to the circuitry.

The routing between the semiconductor die and the package terminal array may be reduced by locating the circuitry of the semiconductor die in a location on the die corresponding to a location of the terminal in the package terminal array that is assigned to the circuitry. For example, the high-voltage circuitry may be aligned vertically over a terminal at the edge of the package terminal array for outputting a high voltage signal. A via may be used to couple the terminal to the output of the high-voltage circuitry on the die. Vertical alignment may refer to the output of the high-voltage circuitry being coupled to a terminal through the via, in which the terminal coupled to the via is the closest terminal in the array by distance from the via. The close proximity of the high-voltage output terminal to the high-voltage circuitry may reduce the resistance at the output of the high-voltage circuit. In some embodiments, some or all of the terminals may be coupled to the high-voltage circuitry or low-voltage circuitry without a redistribution layer (RDL).

The output of the signal path described above may be provided to a load that may be a headphone, speaker, line load, or another type of transducer, such as a haptic or piezoelectric transducer or an ultrasonic transducer, possibly via a connector such as a mono or stereo jack. It will therefore be understood that the audio signal may include data transformed to/from audible sounds, such as music and speech and the like, but that the audio signal may additionally or alternatively comprise ultrasonic data and/or waveforms for driving haptic transducers, and the terms "audio", "audio signal," and "audio output chain" should be understood accordingly.

According to one embodiment, an apparatus may include a package terminal array comprising a plurality of terminals, wherein a spacing between the plurality of terminals of the ball grid array is less than 0.5 mm. The apparatus may also include a first high-voltage circuit configured to output a first signal to a first terminal of the package terminal array that may exceed 15 volts and a second high-voltage circuit configured to output a second signal to a second terminal of the package terminal array that may exceed 15 volts, in which the first high-voltage circuit and the second high-voltage circuit are positioned symmetrically around an axis and in which the first terminal and the second terminal are located at an edge of the package terminal array. The apparatus may further include a low-voltage circuit coupled to at least a third terminal of the package terminal array and positioned between the first high-voltage circuit and the second high-voltage circuit, wherein the low-voltage circuit comprises circuitry organized in columns aligned along an axis and having a width defined by a fraction of the terminal spacing pitch, with the fraction is a ratio of a positive integer number less than or equal to twelve. A first supply rail and a second supply rail may extend through each of the columns. The low-voltage circuit may be configured to output a signal not exceeding 10 volts.

In certain embodiments, the first high-voltage circuit comprises first circuitry components and the second high-voltage circuit comprises second circuitry components, wherein the first circuitry components are organized symmetrically with the second circuitry components around the axis. For example, the first high-voltage circuit may include a first component and the second high-voltage circuit may include a second component that is the same as the first component and configured to perform the same function in the second high-voltage circuit as the first component in the first high-voltage circuit. The first and second components may be located at corresponding locations around the axis of symmetry in the first and second high-voltage circuitry.

In certain embodiments, the first high-voltage circuit comprises first amplifier circuitry and the second high-voltage circuit comprises second amplifier circuitry corresponding to the first high-voltage circuit. For example, the first and second high-voltage circuits may be differential output stages of an amplifier.

In certain embodiments, the low-voltage circuit may include analog circuitry and digital circuitry adjacent to and coupled to the analog circuitry. The high-voltage and low-voltage circuits may be coupled such that a signal path is through the low-voltage circuit and splits to two signal paths through the first and second high-voltage circuits and output to first and second terminals.

In certain embodiments of an audio amplifier, at least one terminal of the package terminal array comprises an input terminal configured to receive an input audio signal, the analog circuitry comprises a modulator, and the first high-voltage circuit and the second high-voltage circuit are configured as a differential amplifier to amplify audio sounds corresponding to sounds contained in the input audio signal received at the input terminal, and the amplified audio sounds output as a high-voltage signal representative of the input audio signal to the first terminal and the second terminal. The first and second terminals may be coupled to a piezoelectric transducer for reproducing audio representative of the input audio signal from the high-voltage signal.

In certain embodiments, the apparatus may also include a first plurality of vertical conductors coupled to the first high-voltage circuit and a first plurality of horizontal conductors coupled to the first plurality of vertical conductors. The first plurality of horizontal conductors may couple the plurality of vertical conductors to terminals of the package terminal array. The first high-voltage circuit may be aligned with the first plurality of vertical conductors. The length of the horizontal conductors is less than a spacing of the package terminal array.

In certain embodiments, the first high-voltage circuit is configured to output the first signal based on feedback received from a third terminal of the package terminal grid array, the second high-voltage circuit is configured to output the second signal based on feedback received from a fourth terminal of the package terminal grid array, and the third terminal and the fourth terminal are located at the edge of the package terminal array. In an apparatus such as an audio amplifier, the feedback at the third terminal and fourth terminal may be received measurements from a load, such as a piezoelectric transducer.

In certain embodiments, the package terminal array may be a ball grid array (BGA). The array may be configured on the apparatus such that a first array (or balls in the case of a BGA) of terminals are configured to receive high-voltage signals and a second array of terminals (or balls in the case of a BGA) are configured to receive low-voltage signals. Low-voltage signals may refer generally to any signal that is lower than a signal that can only be produced under normal operation by the high-voltage circuit. In some configurations, a low-voltage signal may be a voltage that is no higher than the supply voltage of the circuit. The high-voltage circuit may be configured to produce high-voltage signals above the supply voltage by including a charge pump circuit, being coupled to a charge pump circuit, or being coupled to a separate high-voltage voltage supply.

According to another embodiment, a method may include receiving an input signal at an input terminal of a terminal package array. The method may also include processing the input signal in a low-voltage circuit coupled to the input terminal to generate a processed signal, wherein the low-voltage circuit comprises circuitry organized in columns aligned along an axis and having a width defined by a fraction of the spacing of the package terminal array and is positioned between a first high-voltage circuit and a second high-voltage circuit. The method may further include processing the processed signal in the first high-voltage circuit and the second high-voltage circuit, in which the first high-voltage circuit and the second high-voltage circuit are positioned symmetrically around an axis. The output of the first high-voltage circuit and the second high-voltage circuit may be provided to a first terminal of the package terminal array and a second terminal of the package terminal array, respectively, in which the first terminal and the second terminal are located at an edge of the package terminal array.

According to a further embodiment, an apparatus may include an audio amplifier configured to amplify an input audio signal to generate an output audio signal for driving a load. The audio amplifier may include a differential amplifier comprising a first high-voltage circuit configured to amplify a first signal of a differential signal to produce a first high-voltage output signal and comprising a second high-voltage circuit configured to amplify a second signal of the differential signal to produce a second high-voltage output signal, wherein the first high-voltage circuit and the second high-voltage circuit are positioned symmetrically around an axis through the audio amplifier. The audio amplifier may also include a control circuit comprising gate drivers configured to control the first high-voltage circuit and the second high-voltage circuit of the differential amplifier, wherein the control circuit is positioned between the first high-voltage circuit and the second high-voltage circuit. In certain embodiments, the audio amplifier may also include low-voltage analog circuitry comprising a modulator coupled to the first high-voltage circuit and the second high-voltage circuit, wherein the modulator is positioned between the first high-voltage circuit and the second high-voltage circuit. In certain embodiments, the audio amplifier may also include low-voltage digital circuitry comprising digital signal processing circuitry, wherein the low-voltage digital circuitry is coupled to the low-voltage analog circuitry and positioned between the first high-voltage circuit and the second high-voltage circuit. In certain embodiments, the audio amplifier further includes a package terminal array, wherein the first high-voltage circuit is configured to output the first high-voltage output signal to a first terminal of the package terminal array, and wherein the second high-voltage circuit is configured to output the second high-voltage output signal to a second terminal of the package terminal array, and wherein the first terminal and the second terminal are located at an edge of the package terminal array. In certain embodiments of the audio amplifier, the low-voltage digital circuitry and the low-voltage analog circuitry are organized in columns oriented along the axis, and each column of the columns comprise a first supply rail and a second supply rail extending through each column.

According to another embodiment, a method of manufacturing a semiconductor die as part of a wafer-level packaging process may include forming a plurality of dies on a wafer by performing steps comprising: forming a first high-voltage circuit configured to amplify a first input signal and output a first output signal; forming a second high-voltage circuit configured to amplify a second input signal and output a second output signal, wherein the first high-voltage circuit and the second high-voltage circuit are positioned symmetrically around an axis; and forming a low-voltage circuit positioned between the first high-voltage circuit and the second high-voltage, wherein the low-voltage circuit comprises circuitry organized in columns oriented along the axis. The method may also include packaging the plurality of dies on the wafer, wherein the packaging comprises: forming a package terminal array for each of the plurality of dies; coupling the first high-voltage circuit to a first terminal for outputting the first signal; and coupling the second high-voltage circuit to a second terminal for outputting the second signal, wherein the first terminal and the second terminal are located at an edge of the package terminal array. In certain embodiments, the method may also include dicing the wafer to form a plurality of separated dies from the plurality of dies.

Although several embodiments of devices and systems are presented, a device or system that is configured in a certain way may be configured in at least that way, such that it can also be configured in other ways than those specifically described.

The phrase "and/or" means "and" or "or". To illustrate, A, B, and/or C includes: A alone, B alone, C alone, a combination of A and B, a combination of A and C, a combination of B and C, or a combination of A, B, and C. In other words, "and/or" operates as an inclusive or.

The terms "comprise" (and any form of comprise, such as "comprises" and "comprising"), "have" (and any form of have, such as "has" and "having"), and "include" (and any form of include, such as "includes" and "including") are open-ended linking verbs. As a result, an apparatus or system that "comprises," "has," or "includes" one or more elements possesses those one or more elements but is not limited to possessing only those elements. Likewise, a method that "comprises," "has," or "includes," one or more steps possesses those one or more steps, but is not limited to possessing only those one or more steps.

The foregoing has outlined rather broadly certain features and technical advantages of embodiments of the present invention in order that the detailed description that follows may be better understood. Additional features and advantages will be described hereinafter that form the subject of the claims of the invention. It should be appreciated by those having ordinary skill in the art that the conception and specific embodiment disclosed may be readily utilized as a basis for modifying or designing other structures for carrying out the same or similar purposes. It should also be realized by those having ordinary skill in the art that such equivalent constructions do not depart from the spirit and scope of the invention as set forth in the appended claims. Additional features will be better understood from the following description when considered in connection with the accompanying figures. It is to be expressly understood, however, that each of the figures is provided for the purpose of illustration and description only and is not intended to limit the present invention.

BRIEF DESCRIPTION OF THE DRAWINGS

For a more complete understanding of the disclosed system and methods, reference is now made to the following descriptions taken in conjunction with the accompanying drawings.

DETAILED DESCRIPTION

Figure 1:
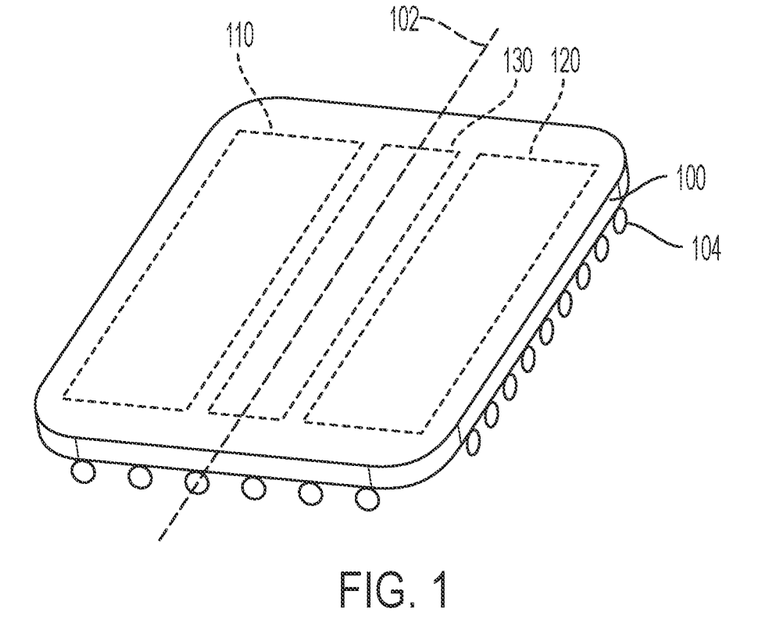
FIG. 1 is a perspective view of a top side of an example packaged semiconductor die with circuitry arranged symmetrically around an axis of the die according to some embodiments of the disclosure.

FIG. 1 is a perspective view of a top-side of a packaged semiconductor die with circuitry arranged symmetrically around an axis of the die according to some embodiments of the disclosure. A packaged die 100 may include a package terminal array 104 for coupling circuitry within the packaged die 100 to other electrical components and/or devices, such as through electrical paths of a printed circuit board (PCB). The packaged die 100 may include circuitry, such as a first high-voltage circuit 110, a second high-voltage circuit 120, and a low-voltage circuit 130. The circuits 110 and 120 may be located in the packaged die 100 in a symmetric arrangement around an axis 102. The circuit 130 may also be located in the packaged die 100 in a symmetric arrangement around axis 102.

High-voltage circuits may refer to circuits that may generate voltages that are higher than those generated by the low-voltage circuits, voltages that are at least twice those generated by the low-voltage circuits, or voltages that are at least triple those generated by the low-voltage circuits. High-voltage circuits may refer to circuits that generate voltages that are higher than a supply voltage for the circuit, circuits that generate voltages that are at least double the supply voltage for the circuit, or circuits that generate voltages that are at least triple the supply voltage for the circuit. In different embodiments, high-voltage circuits may refer to circuits that generate voltages higher than 1.8 volts (such as between 1.8-10 volts, between 1.8-15 volts, or between 1.8-20 volts), higher than 3.3 volts (such as between 3.3-10 volts, between 3.3-15 volts, or between 3.3-20 volts), higher than 5 volts (such as between 5-15 volts, between 5-20 volts, between 5-25 volts), higher than 10 volts (such as between 10-20 volts, between 10-30 volts, or between 10-50 volts), higher than 15 volts (such as between 15-30 volts, between 15-50 volts, or between 15-100 volts), higher than 20 volts (such as between 20-50 volts, between 20-100 volts, or between 20-150 volts), or higher than 25 volts (such as between 25-50 volts, between 25-75 volts, or between 25-150 volts).

Figure 2:
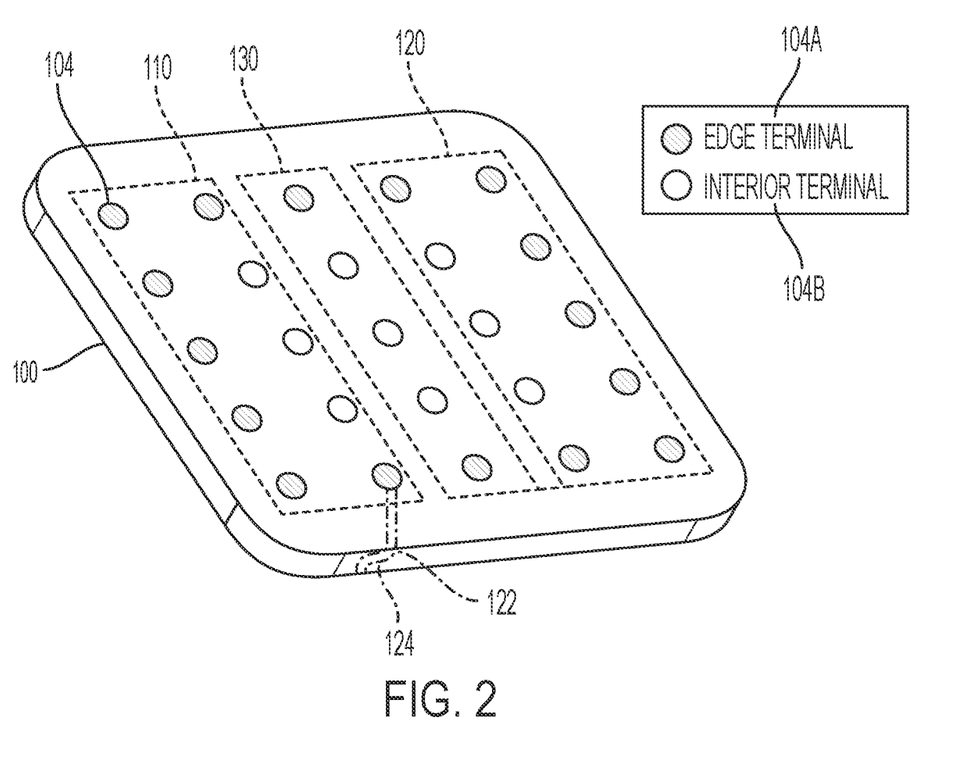
FIG. 2 is a perspective view of a bottom side of an example packaged semiconductor die with circuitry arranged symmetrically around an axis of the die according to some embodiments of the disclosure.

The circuits 110, 120, and 130 are coupled to terminals of the terminal package array 104 to input and output signals to other devices. One arrangement of a terminal package array is shown in FIG. 2. FIG. 2 is a perspective view of a bottom side of a packaged semiconductor die with circuits arranged symmetrically around an axis of the die according to some embodiments of the disclosure. A package terminal array 104 of a packaged die 100 may include edge terminals 104A and interior terminals 104B. The terminals 104A-B may be coupled to the circuits 110, 120, and/or 130 through vertical conductors 122, sometimes referred to as vias, and/or horizontal conductors 124. Edge terminals 104A are located in the array 104 such that at least one side of the edge terminals 104A has no neighboring terminal. That is, the edge terminals 104A are the outermost terminals of the array. The interior terminals 104B each have neighboring terminals in the array and are spaced apart from neighboring terminals by a pitch, which may be less than 0.5 mm. Some of the terminals 104A and 104B may be dummy terminals without affecting whether the terminals are edge or interior terminals.

A printed circuit board (PCB) includes electrical traces that function as electrical paths for coupling inputs and outputs to the packaged die 100 through the package terminal array. Traces to the interior terminals 104B are routed through the spacing between the edge terminals 104A. Traces to the edge terminals 104A are not subject to such spacing constraints. The spacing constraints for reaching interior terminals 104B restrict the widths of the traces that may reach the interior terminals 104B and the spacing possible between those traces. Circuits of the embedded die 100 are organized according to embodiments of this disclosure to locate high-voltage circuits 110 and 120 symmetrically around the axis 102 such that high-voltage outputs of the high-voltage circuits 110 and 120 may be coupled to edge terminals 104A to avoid the spacing constraints for traces reaching the interior terminals 104B.

Figure 3:
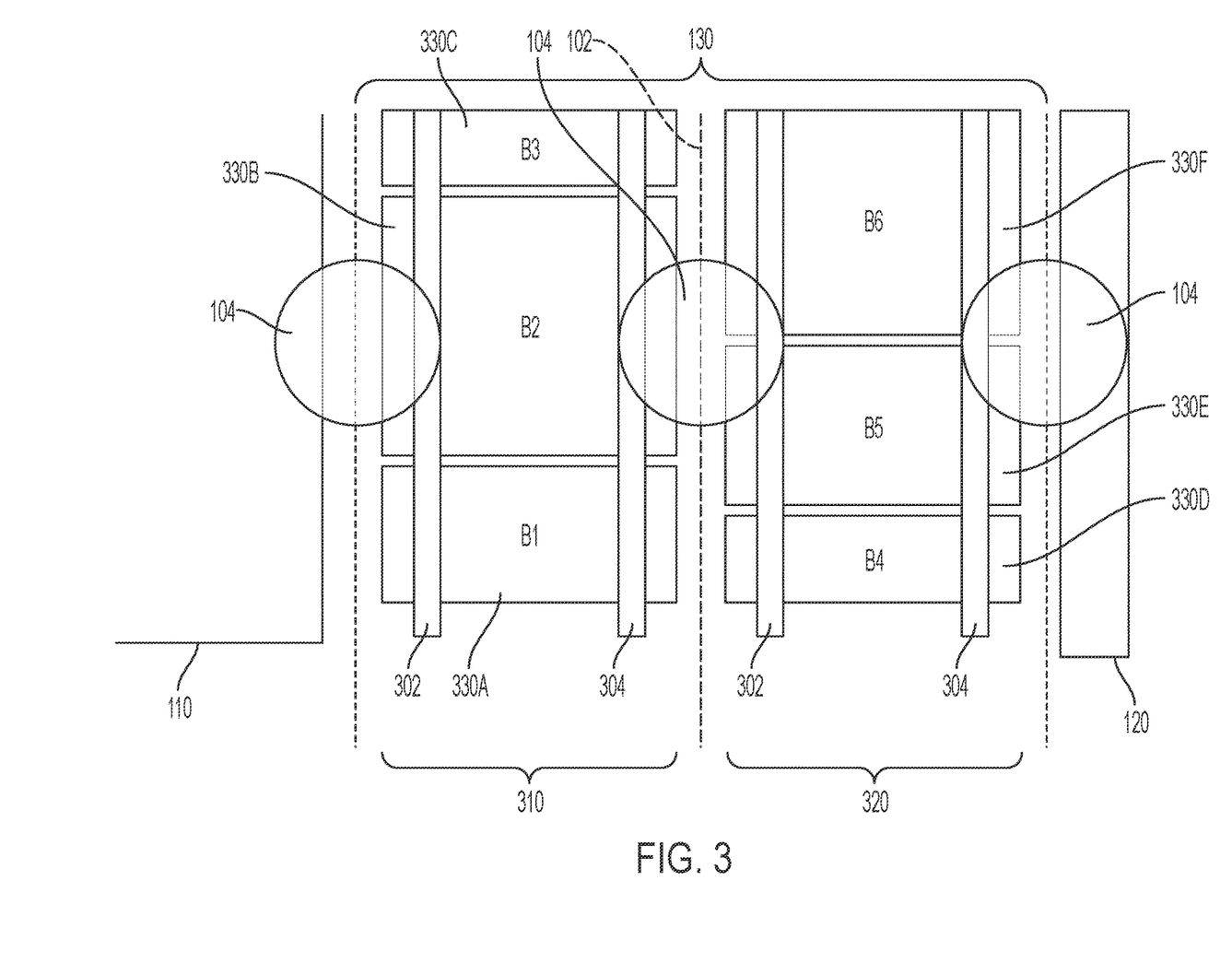
FIG. 3 is a block diagram illustrating a columnar layout for example circuitry according to some embodiments of the disclosure.

Symmetry about the axis for the circuits 110, 120, and 130 may be arranged by organizing components of the circuits into columns. Each column may be defined, in part, by a positive and negative voltage supply rail passing through each column such that all circuits in the column are coupled to the same portion of the supply rail. One column organization for low-voltage circuitry is shown in FIG. 3, although similar columns may be organized in the high-voltage circuits. FIG. 3 is a block diagram illustrating a columnar layout for circuitry according to some embodiments of the disclosure. Low-voltage circuit 130 may be organized into column 310 and column 320. Each of the columns 310 and 320 may be coupled to different portions of a positive voltage supply rail 302. Each of the columns 310 and 320 may be coupled to different portions of a negative voltage supply rail 304. The columns 310 and 320 may be organized around an axis of symmetry 102 and between the high-voltage circuits 110 and 120. A width of the columns 310 and 320 may be defined by a spacing of terminals of the packaging terminal array 104. As shown in FIG. 3, the columns 310 and 320 are defined as a ratio of 1:1 to the pitch of the package terminal array 104. However, other ratios may be used such that multiple columns fit between terminals of the array 104. For example, a ratio of 2:1 results in a column width approximately half the pitch of the array 104, and a ratio of 4:1 results in a column width approximately one quarter the pitch of the array 104. The ratios may be fractions being defined as ratios of positive integer numbers not exceeding 12. Circuits within columns 310 and 320 may be organized into blocks 330A-330F, in which each of the blocks 330A-330F includes components configured to provide separate functions.

Figure 4:
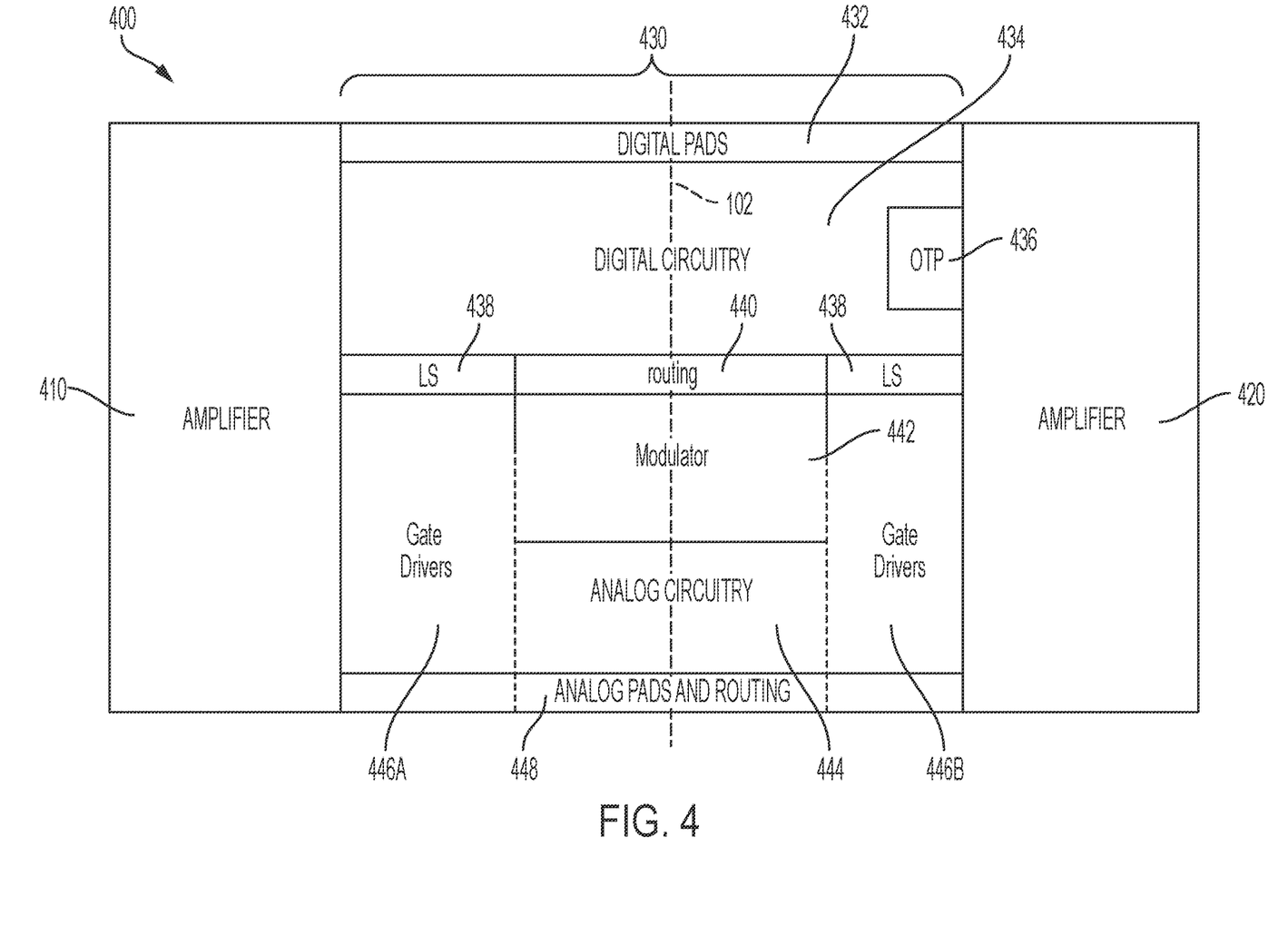
FIG. 4 is a block diagram illustrating an example circuit layout for an audio amplifier with symmetry around an axis of a semiconductor die according to some embodiments of the disclosure.

The circuit layout may be used to construct an audio amplifier for driving a load that reproduces sounds. Driving a transducer for reproduced sounds may involve driving the load with a voltage that is higher than an available supply voltage. For example, a piezoelectric transducer may be driven, at times, by an audio amplifier with a drive signal that is above 15V. One circuit layout for an audio amplifier that is organized in a symmetric manner around an axis is shown in FIG. 4. FIG. 4 is a block diagram illustrating a circuit layout for an audio amplifier with symmetry around an axis of a semiconductor die according to some embodiments of the disclosure. An amplifier 400 may include differential output stages 410 and 420 organized symmetrically around the axis 102 of the circuitry on a semiconductor die. The splitting of the two output stages to physically separate locations may create a feedback loop that creates electromagnetic noise, but the symmetry creates in-phase changes that cancel out such that the physical separation does not reduce the fidelity of output from the separated output stages. Low-voltage circuits may be located between the output stages 410 and 420. The low-voltage circuit 430 may be circuitry configured to operate at voltages lower than the high-voltage circuit of output stages 410 and 420. Low-voltage circuitry 430 may include small-signal analog and digital circuitry. Small-signal circuitry refers to circuitry configured to operate at and output signals with voltage levels lower than 5 Volts. Circuit 430 may include digital pads 432 for receiving a digital input signal, such as a digital audio signal.

Circuit 430 may also include digital circuits 434, which process the digital signals received at the pads 432. The digital circuits 434 may include circuitry for performing operations such as decoding the digital signals, volume leveling, application of equalizer settings, high-definition enhancements, and/or echo or room effects. The digital circuits 434 may be configured to perform particular functions by one-time programmable (OTP) memory 436. For example, the digital circuits 434 may be a digital signal processor (DSP) configured at startup based on firmware in the OTP 436. The output of the digital circuits 434 is routed in routing circuitry 440 to a modulator 442. The modulator 442 modulates the digital signal from digital circuits 434 to an analog signal for amplification by the output stages 410 and 420. The modulator 442 is coupled to analog circuitry 444 and gate drivers 446A-446B for driving amplifier gain stages in the output stages 410 and 420. The analog circuitry 444 may be coupled to analog pads and accompanying routing circuitry 448. Circuit 430 may also include level shifter (LS) circuits 438 located symmetrically around the axis 102 corresponding to the output stages 410 and 420. Output stages 410 and 420 may be high-voltage circuits that are particular examples of the high-voltage circuits 110 and 120 shown in FIG. 1.

Figure 5:
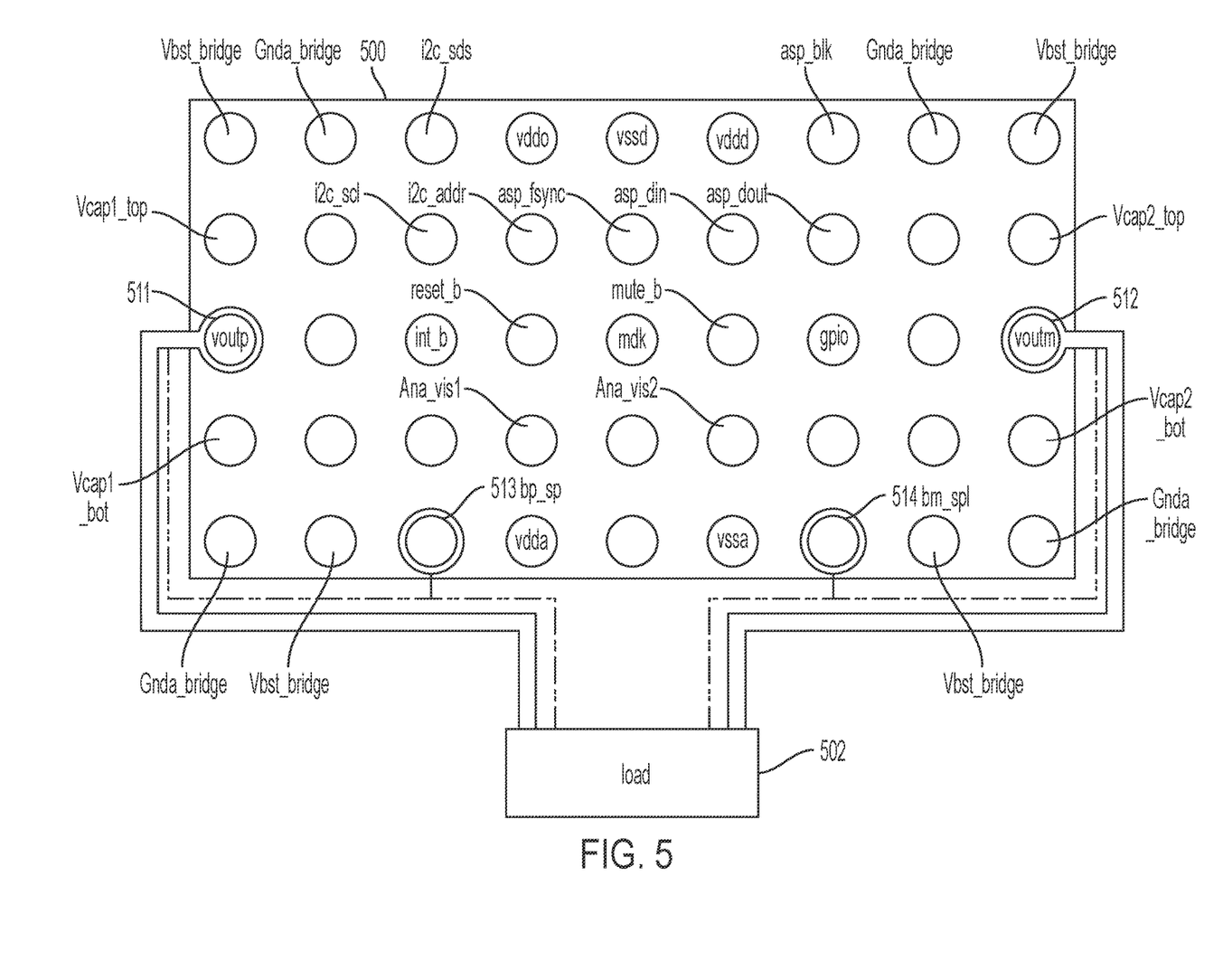
FIG. 5 is a block diagram illustrating an example package terminal array with high-voltage outputs at an edge of the array according to some embodiments of the disclosure.

A packaging terminal array configuration for a packaged die may have high-voltage terminals at an edge of the packaging terminal array as shown in the example configuration of FIG. 5. FIG. 5 is a block diagram illustrating a package terminal array with high-voltage outputs at an edge of the array according to some embodiments of the disclosure. A packaged die 500 may include several terminals including a first terminal 511, a second terminal 512, a third terminal 513, and a fourth terminal 514. The terminals 511-514 may be configured for inputting and/or outputting high-voltage signals by being coupled to appropriate circuitry within high-voltage circuitry within the packaged die 500. For example, terminals 511 and 512 may output amplified signals for driving a load 502, such as a piezoelectric transducer. Terminals 513 and 514 may receive feedback signals from the load 502 that may be used to determine, for example, a voltage across the load and thus may also be high-voltage signals because the signal from terminals 511-512 driving the load 502 may be high-voltage signals. In some embodiments, edge terminals may be used to couple the high-voltage circuits to capacitors that are used to generate voltages to a high voltage that is above the supply voltage level. Other signals coupled to edge terminals may include Vbst_bridge, Gnda_bridge, Vcap1_top, Vcap1_bot, vdda, vssa, Vcap2_bot, Vcap2_top, vddd, and asp_blk, although not all of these signals necessarily may be high-voltage signals. Signals coupled to interior terminals may include clock, supply, control, and information signals, such as i2c_sda, i2c_scl, init_b, reset_b, i2c_addr, vddio, vssd, asp_fsync, mclk, mute_b, asp_dm, asp_dout, gpio, Ana_vis1, and Ana_vis2.

Figure 6:
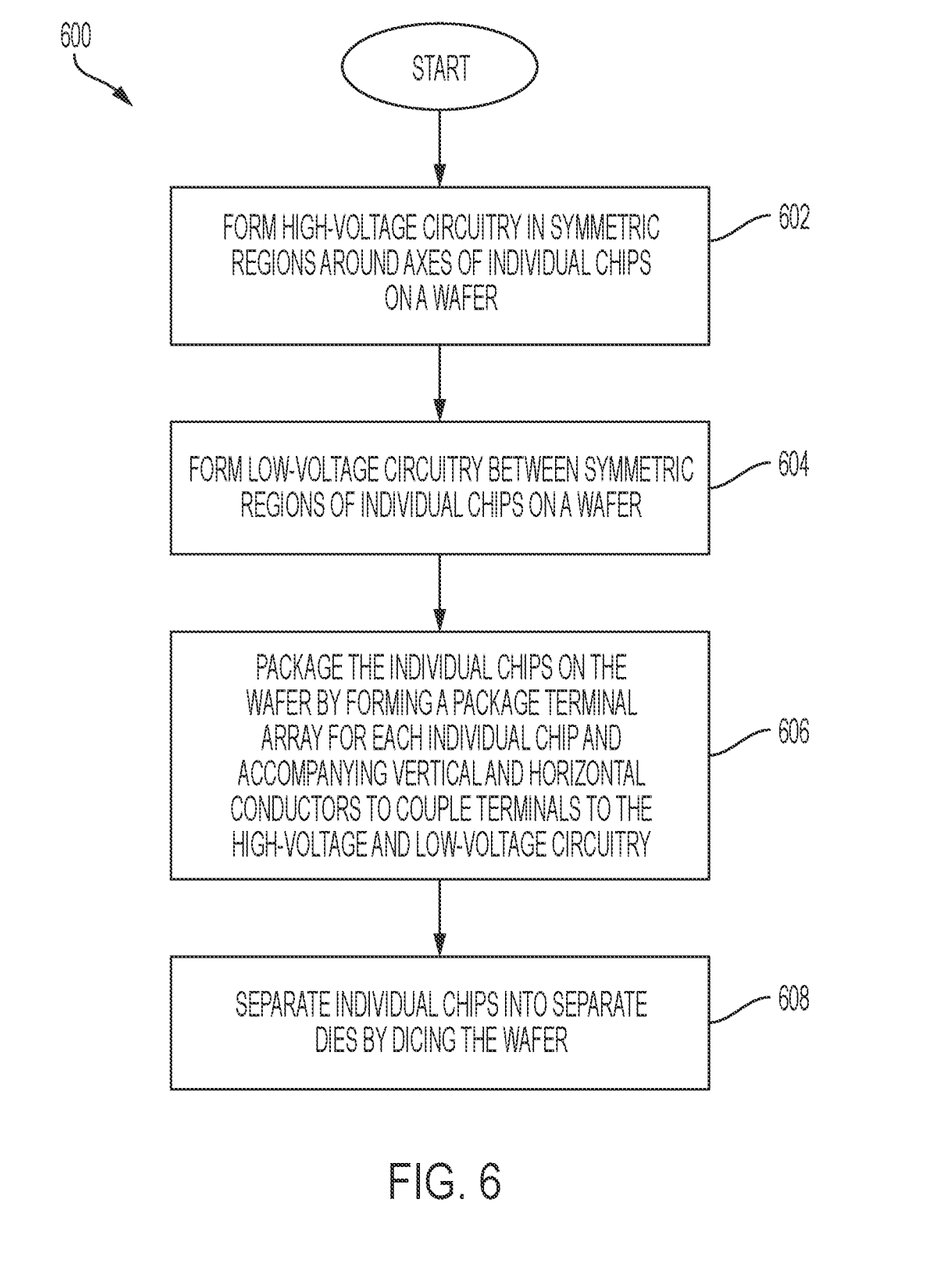
FIG. 6 is a flow chart illustrating an example method of wafer-level packaging for packaging semiconductor dies with circuitry arranged symmetrically around axes of the dies according to some embodiments of the disclosure.

The packaging terminal arrays may be formed on the packaged dies at the wafer-level as described in the example manufacturing process of FIG. 6. FIG. 6 is a flow chart illustrating a method of wafer-level packaging for packaging semiconductor dies with circuitry arranged symmetrically around axes of the dies according to some embodiments of the disclosure. A method 600 begins at block 602 with forming high-voltage circuitry in symmetrical regions around axes of individual chips on a wafer. The forming of circuitry may include steps including preparing a substrate, implanting dopant to the substrate, depositing metal and insulating layers on the substrate to form transistor structures, resistor structures, and/or capacitor structures. For example, a transistor with source, drain, and gate regions may be formed, with a gate electrode structure above the gate region and various contacts to the source, drain, and gate of the transistors. Metal layers over the transistor and other structures may be formed to interconnect the structures to obtain an output stage of a differential amplifier. The forming of block 602 may form the structures in a layout with symmetrical high-voltage circuits organized around an axis, such as described above with reference to FIG. 1, FIG. 2, FIG. 3, or FIG. 4.

At block 604, low-voltage circuitry is formed between symmetric regions of high-voltage circuitry on individual chips on the wafer. The forming at block 604 may include steps similar to those described for forming the high-voltage circuitry but used to form different circuitry with different interconnects to obtain low-voltage circuitry, such as digital processing circuitry. The forming of block 604 may form the structures in a layout with low-voltage circuits organized in columns between the high-voltage circuits, such as described above with reference to FIG. 1, FIG. 2, FIG. 3, or FIG. 4. The forming of the low-voltage circuits at block 604 and the high-voltage circuits at block 602 may be performed in a different order or interchangeable to obtain a wafer with a plurality of dies.

The steps of blocks 602 and 604 are used to form a plurality of dies on a semiconductor wafer. Each of the dies may be further processed on the wafer, and later separated into separate chips for use in products, such as mobile phones, headphones, tablet computing devices, or other computing or audio devices. At block 606, the individual chips are packaged on the wafer by forming a package and a package terminal array for each individual chip and accompanying vertical and horizontal conductors to couple terminals of the array to the high-voltage and low-voltage circuitry. The package terminal array may be coupled to circuitry on the die with high-voltage outputs and inputs coupled to edge terminals of the array, such as described above with reference to FIG. 2 or FIG. 5. At block 608, the individual chips are separated to form separate packaged dies by dicing the wafer.

Figure 7:
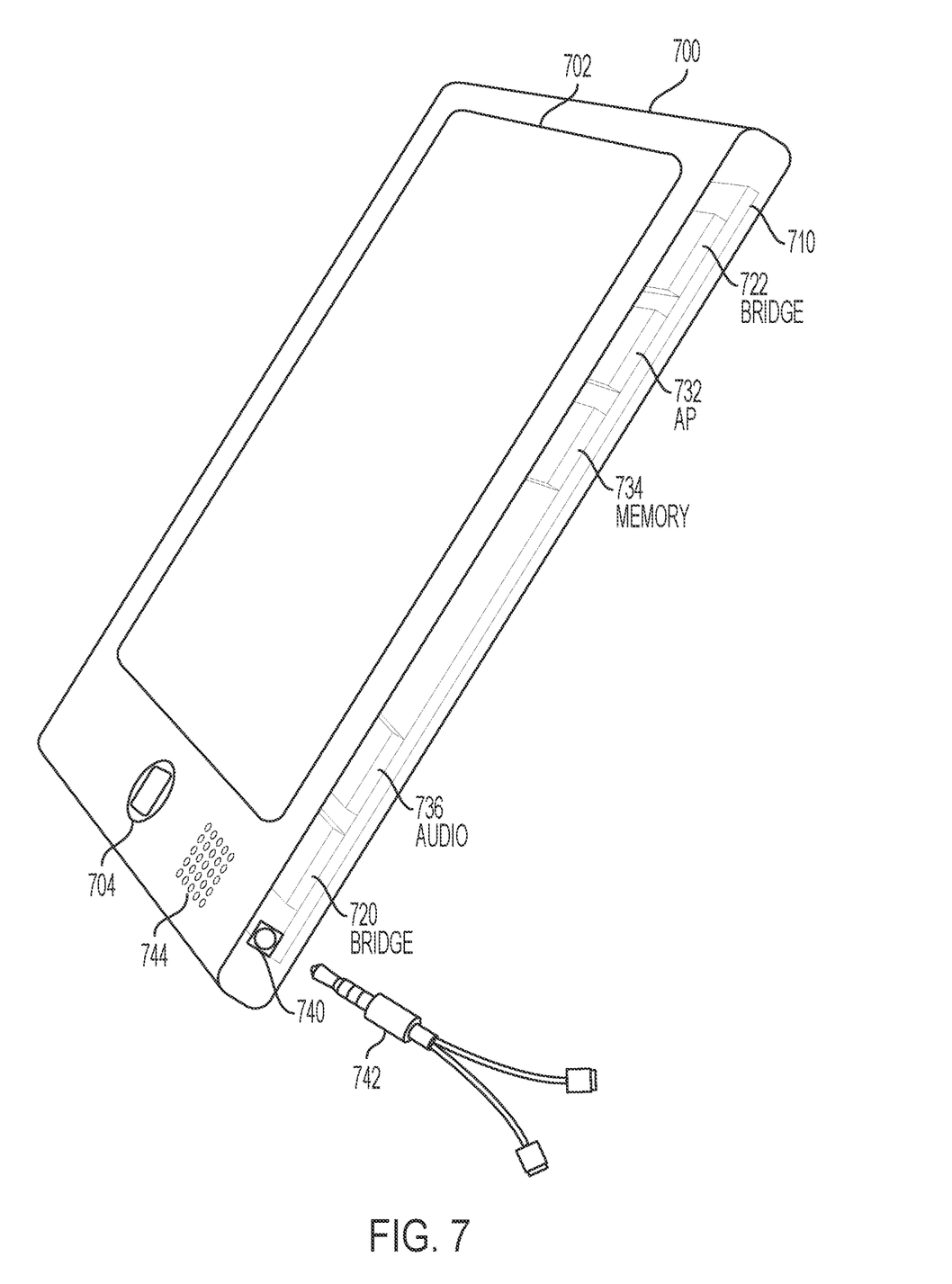
FIG. 7 is an illustration showing an example mobile device for audio playback including an isochronous channel according to one embodiment of the disclosure.

An audio amplifier is one example of high-voltage circuitry that may be organized on a die as described above. Such an audio amplifier may be used for producing audio output in a variety of electronic devices, such as portable media players, cell phones, laptop computers, stereo systems, and other devices that convert stored audio data into an audio output. One advantageous embodiment for such an audio amplifier with symmetric high-voltage output stages coupled to edge terminals of a package terminal array is a mobile device for playing back music, high-fidelity music, and/or speech from telephone calls. FIG. 7 is an illustration showing an example mobile device for audio playback including such an audio amplifier according to one embodiment of the disclosure. A mobile device 700 may include a display 702 for allowing a user to provide user input to the mobile device 700. One or more physical buttons 704 may also allow a user to provide user input to the mobile device 700. The mobile device 700 may also include a printed circuit board (PCB) 710 interconnecting components that provide the functionality of mobile device 700. For example, application processor (AP) 732, memory 734, and audio amplifier 736 components may be attached to the PCB 710. Communications between the components may be provided through conductors on or in the PCB 710. Communication bridge chips 720 and 722 coupled to endpoints of the conductors may include processing and memory circuitry that provide interfaces for transmitting and receiving data between components 732, 734, and 736. The audio amplifier 736 may provide an audio output signal to a headphone jack 740, for driving a transducer, such as headphones 742. The audio component 736 may also be coupled to an internal speaker 744, such as a piezoelectric transducer. Conductors in or on the PCB 710 may route a signal from a high-voltage output at an edge terminal of a package terminal array of the audio amplifier 736 to the speaker 744. Such a routing of the PCB may reduce spacing issues with routing conductors carrying high-voltage signals between other terminals in the array to reach an interior terminal. The audio amplifier 736 may provide signal processing, digital-to-analog conversion (DAC), filtering, and/or amplification, using circuitry described such as with reference to FIG. 4, to audio files received from memory 734 for output to a user. Although the data received at the audio amplifier 736 is described as received from memory 734, the audio data may also be received from other sources, such as an universal serial bus (USB) connection, a device connected through Wi-Fi to the mobile device 700, a cellular radio, an Internet-based server, another wireless radio, and/or another wired connection.

The schematic flow chart diagram of FIG. 6 is generally set forth as a logical flow chart diagram. As such, the depicted order and labeled steps are indicative of aspects of the disclosed method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagram, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

The operations described above as performed by high-voltage or low-voltage circuits may be performed by any circuit configured to perform the described operations. Such a circuit may include logic circuitry, such as transistors configured as logic gates, and memory circuitry, such as transistors and capacitors configured as dynamic random access memory (DRAM), electronically programmable read-only memory (EPROM), or other memory devices. The logic circuitry may be configured through hard-wire connections or through programming by instructions contained in firmware. Further, the logic circuitry may be configured as a general-purpose processor capable of executing instructions contained in software and/or firmware.

If implemented in firmware and/or software, functions described above may be stored as one or more instructions or code on a computer-readable medium. Examples include non-transitory computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise random access memory (RAM), read-only memory (ROM), electrically-erasable programmable read-only memory (EEPROM), compact disc read-only memory (CD-ROM) or other optical disk storage, magnetic disk storage or other magnetic storage devices, or any other medium that can be used to store desired program code in the form of instructions or data structures and that can be accessed by a computer. Disk and disc includes compact discs (CD), laser discs, optical discs, digital versatile discs (DVD), floppy disks and Blu-ray discs. Generally, disks reproduce data magnetically, and discs reproduce data optically. Combinations of the above should also be included within the scope of computer-readable media.

Although the present disclosure and certain representative advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. For example, although audio amplifiers are described in portions of the detailed description, aspects of the invention may be applied to the design of or implemented on different kinds of circuitry, including processors such as graphics processing units (GPUs), central processing units (CPUs), and digital signal processors (DSPs). As another example, although processing of certain kinds of data, such as audio data, may be described in example embodiments, other kinds or types of data may be processed through the methods and devices described above. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. An apparatus, comprising:
   a package terminal array comprising a plurality of terminals, wherein a spacing between adjacent terminals is less than 0.5 mm;
   a first high-voltage circuit configured to output a first signal to a first terminal of the package terminal array that may exceed 15 volts;
   a second high-voltage circuit configured to output a second signal to a second terminal of the package terminal array that may exceed 15 volts; and
   a low-voltage circuit coupled to a third terminal of the package terminal array and positioned between the first high-voltage circuit and the second high-voltage circuit, wherein the low-voltage circuit comprises circuitry organized in columns oriented along an axis and the columns having a width defined by a fraction of the spacing of the package terminal array,
   wherein:
      the fraction is a ratio of a positive integer number less than or equal to twelve,
      the first high-voltage circuit and the second high-voltage circuit are positioned symmetrically around the axis, and
      the first terminal and the second terminal are located at an edge of the package terminal array.

2. The apparatus of claim 1, wherein the first high-voltage circuit comprises first circuitry components and the second high-voltage circuit comprises second circuitry components, wherein the first circuitry components are organized symmetrically with the second circuitry components around the axis.

3. The apparatus of claim 2, wherein the first high-voltage circuit comprises first amplifier circuitry and the second high-voltage circuit comprises second amplifier circuitry corresponding to the first high-voltage circuit.

4. The apparatus of claim 1, wherein the low-voltage circuit comprises:
   analog circuitry; and
   digital circuitry adjacent to and coupled to the analog circuitry.

5. The apparatus of claim 4, wherein:
   at least one terminal of the package terminal array comprises an input terminal configured to receive an input audio signal;
   the first high-voltage circuit and the second high-voltage circuit are configured as output stages of a differential amplifier to amplify the input audio signal received at the input terminal for output as a high-voltage signal representative of the input audio signal to the first terminal and the second terminal; and
   the analog circuitry comprises a modulator.

6. The apparatus of claim 5, further comprising a piezoelectric transducer coupled to the first terminal and to the second terminal for reproducing audio representative of the input audio signal from the high-voltage signal.

7. The apparatus of claim 1, further comprising:
   a first plurality of vertical conductors coupled to the first high-voltage circuit; and
   a first plurality of horizontal conductors coupled to the first plurality of vertical conductors,
   wherein:
      the first plurality of horizontal conductors couple the plurality of vertical conductors to terminals of the package terminal array,
      the first high-voltage circuit is aligned with the first plurality of vertical conductors such that a length of the horizontal conductors is less than a spacing of the package terminal array.

8. The apparatus of claim 1, wherein:
   the first high-voltage circuit is configured to output the first signal based on feedback received from a third terminal of the package terminal grid array,
   the second high-voltage circuit is configured to output the second signal based on feedback received from a fourth terminal of the package terminal grid array,
   the third terminal and the fourth terminal being located at the edge of the package terminal array.

9. The apparatus of claim 1, further comprising:
   a first supply rail extending through each column;
   and a second supply rail extending through each column.

10. The apparatus of claim 1, wherein the low-voltage circuit is configured to output a signal not exceeding 10 Volts.

11. The apparatus of claim 1, wherein the package terminal array comprises a ball grid array (BGA).

12. The apparatus of claim 1, wherein the first high-voltage circuit and the second high-voltage circuit each comprises circuitry organized in columns aligned along the axis and the columns have a width defined by a fraction of the spacing of the package terminal array.

13. The apparatus of claim 1, wherein the package terminal array comprises:
   a first array of terminals configured to receive high-voltage signals; and
   a second array of terminals configured to receive low-voltage signals,
   wherein no terminals of the first array are located in an interior of the package terminal array.

14. An apparatus, comprising:
   an audio amplifier configured to amplify an input audio signal to generate an output audio signal for driving a load, comprising:
      a package terminal array comprising a plurality of terminals, wherein a spacing between the plurality of terminals is less than 0.5 mm;
      a differential amplifier comprising a first high-voltage circuit configured to amplify a first signal of a differential signal to produce a first high-voltage output signal at a first terminal of the package terminal array, the differential amplifier further comprising a second high-voltage circuit configured to amplify a second signal of the differential signal to produce a second high-voltage output signal at a second terminal of the package terminal array, wherein the first high-voltage circuit and the second high-voltage circuit are positioned symmetrically around an axis through the audio amplifier, and wherein the first terminal and the second terminal are located at an edge of the package terminal array;

a control circuit comprising gate drivers configured to control the first high-voltage circuit and the second high-voltage circuit of the differential amplifier, wherein the control circuit is positioned between the first high-voltage circuit and the second high-voltage circuit.

15. The apparatus of claim 14, further comprising low-voltage analog circuitry comprising a modulator coupled to the first high-voltage circuit and the second high-voltage circuit, wherein the modulator is positioned between the first high-voltage circuit and the second high-voltage circuit.

16. The apparatus of claim 15, further comprising low-voltage digital circuitry comprising digital signal processing circuitry, wherein the low-voltage digital circuitry is coupled to the low-voltage analog circuitry and positioned between the first high-voltage circuit and the second high-voltage circuit.

17. The apparatus of claim 16, wherein:

the low-voltage digital circuitry and the low-voltage analog circuitry are organized in columns oriented along the axis, and each column of the columns comprises a first supply rail and a second supply rail extending through each column.

18. The apparatus of claim 17, wherein the package terminal array comprises:

a first array of terminals configured to receive high-voltage signals; and a second array of terminals configured to receive low-voltage signals, wherein no terminals of the first array are located in an interior of the package terminal array.

19. A method, comprising:

forming a plurality of dies on a wafer by performing steps comprising:

forming a first high-voltage circuit configured to amplify a first input signal and output a first output signal;

forming a second high-voltage circuit configured to amplify a second input signal and output a second output signal, wherein the first high-voltage circuit and the second high-voltage circuit are positioned symmetrically around an axis; and forming a low-voltage circuit positioned between the first high-voltage circuit and the second high-voltage, wherein the low-voltage circuit comprises circuitry organized in columns oriented along the axis;

packaging the plurality of dies on the wafer, wherein the packaging comprises:

forming a package terminal array for each of the plurality of dies;

coupling the first high-voltage circuit to a first terminal for outputting the first signal; and coupling the second high-voltage circuit to a second terminal for outputting the second signal, wherein the first terminal and the second terminal are located at an edge of the package terminal array.

20. The method of claim 19, further comprises dicing the wafer to form a plurality of separated dies from the plurality of dies.

* * * * *

UNITED STATES PATENT AND TRADEMARK OFFICE
CERTIFICATE OF CORRECTION

PATENT NO. : 11,942,468 B2
APPLICATION NO. : 17/303251
DATED : March 26, 2024
INVENTOR(S) : Khenkin et al.

It is certified that error appears in the above-identified patent and that said Letters Patent is hereby corrected as shown below:

On the Title Page

In Item (72), under "Inventors", in Column 1, Line 1, delete "Aleksey Khenkin," and insert -- Aleksey S. Khenkin, --, therefor.

In the Specification

In Column 1, Line 62, delete "may be" and insert -- may --, therefor.

In Column 11, Line 62, delete "conversion" and insert -- converter --, therefor.

In Column 12, Line 30, delete "electronically" and insert -- erasable --, therefor.

Signed and Sealed this
Twentieth Day of August, 2024

Katherine Kelly Vidal
*Director of the United States Patent and Trademark Office*